US008166377B2

(12) United States Patent
Chu et al.

(10) Patent No.: US 8,166,377 B2
(45) Date of Patent: Apr. 24, 2012

(54) CONFIGURABLE HIERARCHICAL COMMA-FREE REED-SOLOMON DECODING CIRCUIT AND METHOD THEREOF

(75) Inventors: Yuan-Sun Chu, Minsyong Township, Chiayi County (TW); Yi-Ren Chen, Kaohsiung (TW); Chia-Ying Huang, Kaohsiung (TW); Chi-Fang Li, Minsyong Township, Chiayi County (TW)

(73) Assignee: National Chung Cheng University, Chia-Yi (TW)

( * ) Notice: Subject to any disclaimer, the term of this patent is extended or adjusted under 35 U.S.C. 154(b) by 647 days.

(21) Appl. No.: 12/423,897

(22) Filed: Apr. 15, 2009

(65) Prior Publication Data

US 2010/0146373 A1 Jun. 10, 2010

(30) Foreign Application Priority Data

Dec. 5, 2008 (TW) .............................. 97147562 A

(51) Int. Cl.
*H03M 13/00* (2006.01)
(52) U.S. Cl. ...................................................... 714/784
(58) Field of Classification Search .......... 714/752–757, 714/760, 774, 781, 784–787, 819, 822
See application file for complete search history.

(56) References Cited

U.S. PATENT DOCUMENTS

| | | | | |
|---|---|---|---|---|
| 6,928,600 B2* | 8/2005 | Li et al. | ........................ | 714/775 |
| 7,633,976 B2* | 12/2009 | Shieh et al. | .................... | 370/513 |
| 2003/0196161 A1* | 10/2003 | Li et al. | ........................ | 714/784 |
| 2008/0244364 A1* | 10/2008 | Shieh et al. | .................... | 714/784 |

OTHER PUBLICATIONS

C.-F. Li; et al. A low-power ASIC design for cell search in the W-CDMA system IEEE J. Solid-State Circuit. vol. 39. No. 5, pp. 852-857, May 2004.
D. W. Jarvis and T.-W. Kao A third generation CDMA receiver implementation to the cdma 2000 standard in Proc. 33rd Southeastern Symp. Syst. Theory, Mar. 2001, pp. 41-45.
L. Philips; et al. A baseband IC for 3G UMTS comunications in Proc. IEEE Veh. Technol. Conf., Sep. 1999, vol. 3, pp. 1521-1524.
G. Chien; et al. A 2.4 GHz CMOS transceiver and baseband processor chipset for 802.11 gb wireless LAN application IEEE Solid-State Circuits Conf. Dig. Tech. Papers, Feb. 2003.
H. Tomiyama; et al. A low voltage (1.8 V) operation triple band WCDMA transceiver IC in Proc. IEEE Radio Frequency Integr. Circuits Symp., San Francisco, CA, 2006.

(Continued)

*Primary Examiner* — Nadeem Iqbal
(74) *Attorney, Agent, or Firm* — Ming Chow; Sinorica, LLC

(57) ABSTRACT

The present invention discloses a configurable hierarchical comma-free Reed-Solomon decoding circuit and a method thereof. The design is based on an original hierarchical parallel architecture which not only completes a decoding process faster than conventional decoder, but also utilizes less hardware to perform various algorithms with less power consumed. The architecture of the present invention has higher decoding rate than the conventional systolic architecture by a cycle ratio of 22 to 94. Further, the present invention does not require the use of ROM to store 64 sets of codewords and uses logic gates less than one fourth of the logic gates than conventional systolic architecture. As a result, the circuit of the present invention occupies less area than the conventional architecture. The circuit of the present invention is also configurable for different applications, so it can always find an optimal compromise between speed and power consumption for various decoding requirements.

23 Claims, 13 Drawing Sheets

OTHER PUBLICATIONS

D. Kaczman; et al. A single-chip tri-band (2100, 1900, 850/800 MHz) WCDMA/HSDPA cellular transceiver IEEE J. Solid-State Circuits, vol. 38, No. 5, pp. 1122-1132, May 2006.

G. Uvieghare; et al. A highly-integrated 3G CDMA2000 1X cellular baseband chip with GSM/AMPS/GPS/Bluetooth/Multimedia capabilities and ZIF RF support IEEE Solid-State Circuits.

J. Zipper; et al. A single-chip dual-band CDMA2000 transceiver in 0.13 UM CMOS IEEE Solid-State Circuits Conf. Dig. Tech. Papers, Feb. 2007, pp. 342-343.

C.-F. Li; et al. A fast multispeed comma-free reedOsolomon decoder for W-CDMA applications using foldable systolic array architecture IEEE J. Solid-State Circuits, vol. 38, no.

K.-H. Chen and Y.-S. Chu A low-power multiplier with the spurious power suppression technique IEEE Trans. Very Large Scale Integr. (VLSI) Syst., vol. 15, No. 7, pp. 846-850, Ju.

K. H. Chen; et al. Design exploration of a spurious power suppression technique(SPST) and its applications Proc. IEEE Asian Solid-State Circuits Conf., Hsinchu, Taiwan. R.O.C.

Y.-J. Chen A low power synchronizer for multi-standard wireless communication systems Master's thesis, Dept. of Electr. Eng., National Chung Cheng Univ., Chia-Yi, Taiwan, R.O.

\* cited by examiner

| Folding time(s) | Array size | Decoding latency |
|---|---|---|
| 0 | 64x15 | 94 |
| 1 | 32x15 | 94 |
| 2 | 16x15 | 94 |
| 3 | 8x15 | 135 |
| 4 | 4x15 | 255 |
| 5 | 2x15 | 495 |
| 6 | 1x15 | 975 |

Fig. 6 (Prior art)

CONFIGURABLE HIERARCHICAL COMMA-FREE REED-SOLOMON DECODING CIRCUIT AND METHOD THEREOF

BACKGROUND OF THE INVENTION

1. Field of the Invention

The present invention relates to a decoding circuit, particularly to a configurable hierarchical comma-free Reed-Solomon decoding circuit.

2. Description of the Related Art

In a WCDMA (Wideband Code Division Multiple Access) communication system, the comma-free Reed-Solomon (CFRS) code is decoded to define the frame boundary and the scrambling code group in the second stage of the synchronization process. The CFRS code has the features of the comma-free code and the Reed-Solomon code. The comma-free code is characterized in that none combination of successive members can form a new comma-free code. Further, the comma-free code has the capabilities of debug and synchronization. The WCDMA system relies on the synchronization capability of the comma-free code in synchronizing the frame. In common applications, the comma-free code is usually decoded with a simple continuous correlator. However, the comma-free code is not continuously but intermittently transmitted in a WCDMA system. Therefore, common comma-free decoders cannot apply to the synchronization process of the WCDMA system. There are not many existing papers concerning the comma-free Reed-Solomon decoding circuits for the WCDMA system. Refer to FIG. 1 for the most recent prior art of the CFRS decoding circuit for the WCDMA system. The decoding circuit is based on a systolic array architecture and can quickly perform decoding to meet the requirements of various synchronization algorithms. The decoding circuit comprises an input-signal generator (such as that shown in FIG. 2), 64×15 pieces of processing elements (such as that shown in FIG. 3), and 64×1 pieces of boundary processing elements (such as that shown in FIG. 4). During decoding, the CFRS code is loaded into the input-signal generator, and the input-signal generator sequentially generates fifteen combinations of cyclic shifts. The cyclic shifts are input into the 64×15 processing element array in an oblique manner. The processing element array compares the fifteen combinations of cyclic shifts with sixty-four sets of pre-stored codes. Each row of the processing element array performs the comparison for one set of probable CFRS code. The boundary processing element of the same row finds out the most probable cyclic shift for the result output by the row. Then, the most probable cyclic shifts for the results of all the rows are checked vertically top down to find out the maximum cyclic shift among the rows, and the lowest boundary processing element outputs the result of decoding. Refer to FIG. 5. The prior art also proposes a folding technology to reduce the size of the systolic array from 64×15 to (32, 16, 8, 4, 2, or 1)×15, whereby the area of the systolic array is decreased. Similarly, the size of the boundary array is reduced from 64×1 to (32, 16, 8, 4, 2, or 1)×1. However, as shown in FIG. 6, the restricted decoding rate thereof is still hard to satisfy designers.

To overcome the abovementioned problems, the present invention proposes a configurable hierarchical CFRS decoding circuit, which is able to determine the frame boundary and the scrambling code group after the fifteen secondary synchronization codes have been sequentially attained in the second stage of the three-stage code synchronization of a WCDMA system. Based on a hierarchical parallel architecture, the present invention appropriately controls the path of data flow to achieve a configurable decoding circuit, whereby the user can configure the speed and power consumption of the decoding circuit to satisfy various applications.

SUMMARY OF THE INVENTION

The primary objective of the present invention is to provide a configurable hierarchical CFRS decoding circuit, particularly a decoding circuit, which is used to determine the frame boundary and the scrambling code group after the fifteen secondary synchronization codes have been sequentially attained in the second stage of the three-stage code synchronization of a WCDMA system, and which is based on a hierarchical parallel architecture and able to appropriately control the path of data flow to achieve a configurable decoding circuit, whereby the user can configure the speed and power consumption of the decoding circuit to satisfy various application requirements.

The configurable hierarchical CFRS decoding circuit of the present invention comprises an input-pattern generator, a boundary processing element (BPE) array, a group index multiplexer and a cyclic shift counter. The input-pattern generator further comprises a shift register, a coefficient multiplexer and a processing element (PE) array. The input-pattern generator generates a combination of at least one cyclic shift for a received comma-free Reed-Solomon (CFRS) code with an arbitrary cyclic shift and outputs the combination by a hierarchical parallel way. The shift register receives codewords of the CFRS code, performs cyclic shifts on the codewords of the CFRS code, and outputs the CFRS code with a plurality of cyclic shifts. The coefficient multiplexer includes a plurality of multiplexers with different sizes, receives the codewords, performs comparisons on the codewords, and outputs comparison results. The processing element (PE) array includes a plurality of processing elements, performs related comparisons on all probable cyclic shifts generated by the shift register and all CFRS codes, and outputs comparison results. The boundary processing element (BPE) array includes a plurality of boundary processing elements, receives and performs comparisons on values output by the input-pattern generator, and stories the larger values in a register. The group index multiplexer attaches group indexes to the related values output by the processing element array and transmits the indexed related values to the boundary processing element array, and then the boundary processing element array performs comparisons to obtain a coefficient required by CFRS decoding. The cyclic shift counter outputs the cyclic shifts. The present invention also proposes a method for configurablizing a hierarchical CFRS decoding circuit, which comprises steps of: generating a combination of at least one cyclic shift for a received CFRS code with an arbitrary cyclic shift and outputting the combination by a hierarchical parallel way; performing comparisons on all output values and storing the greater output values in a register; and comparing the values stored in the register with the related values of the system to obtain coefficients required by CFRS decoding.

Below, the embodiments are described in detail in cooperation with the attached drawings to make easily understood the objectives, technical contents, characteristics and accomplishments of the present invention.

BRIEF DESCRIPTION OF THE DRAWINGS

FIG. 6 is a table showing the comparison of decoding rates;

DETAILED DESCRIPTION OF THE INVENTION

The present invention discloses a configurable hierarchical CFRS decoding circuit and a method thereof, particularly to a CFRS decoding circuit, which is based on a hierarchical parallel architecture and able to appropriately control the path of data flow to achieve a configurable decoding circuit, whereby the user can configure the speed and power consumption of the decoding circuit to satisfy various applications.

Figure 1:
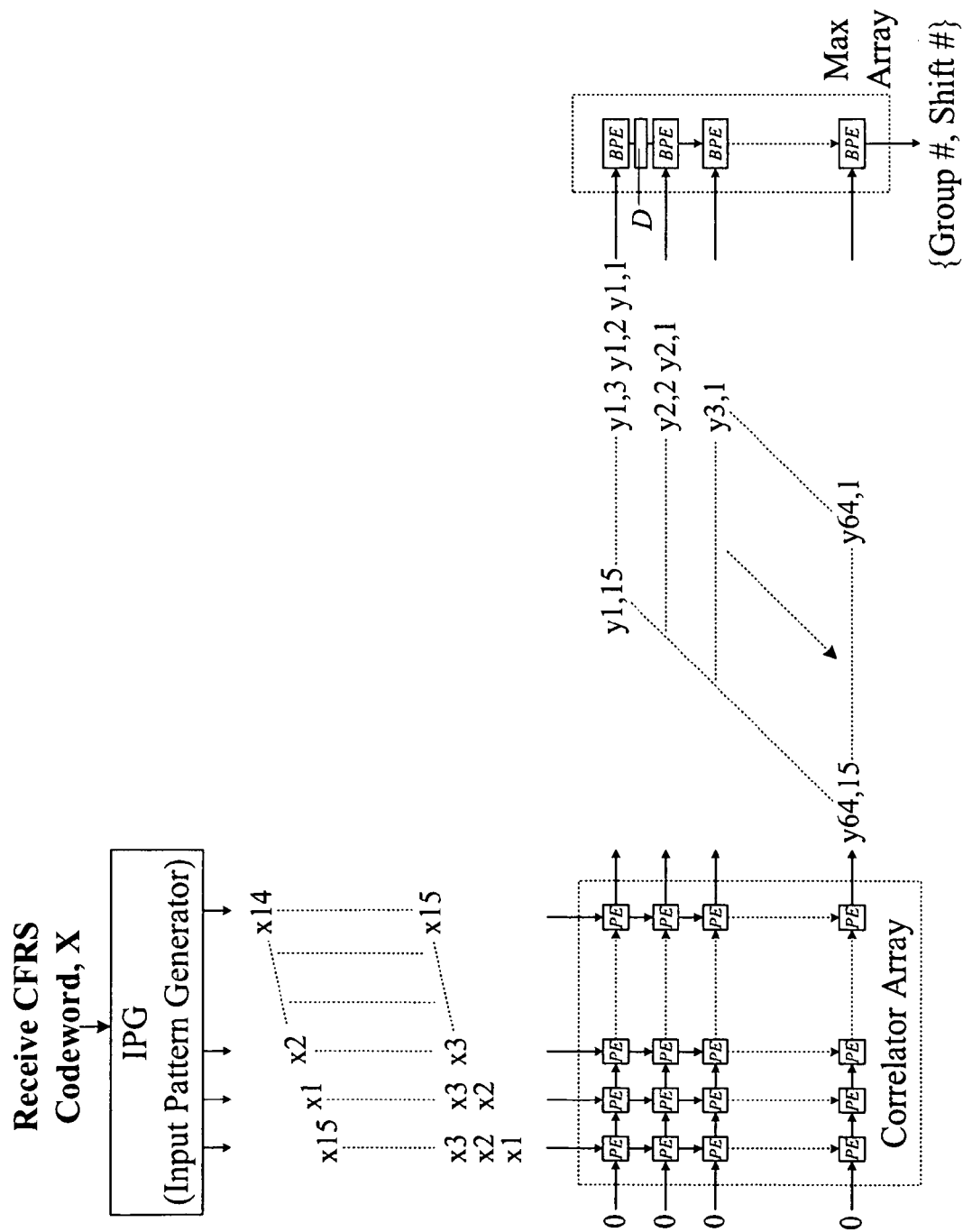
FIG. 1 is a diagram schematically showing a CFRS decoding circuit of a conventional systolic array architecture.
Figure 2:
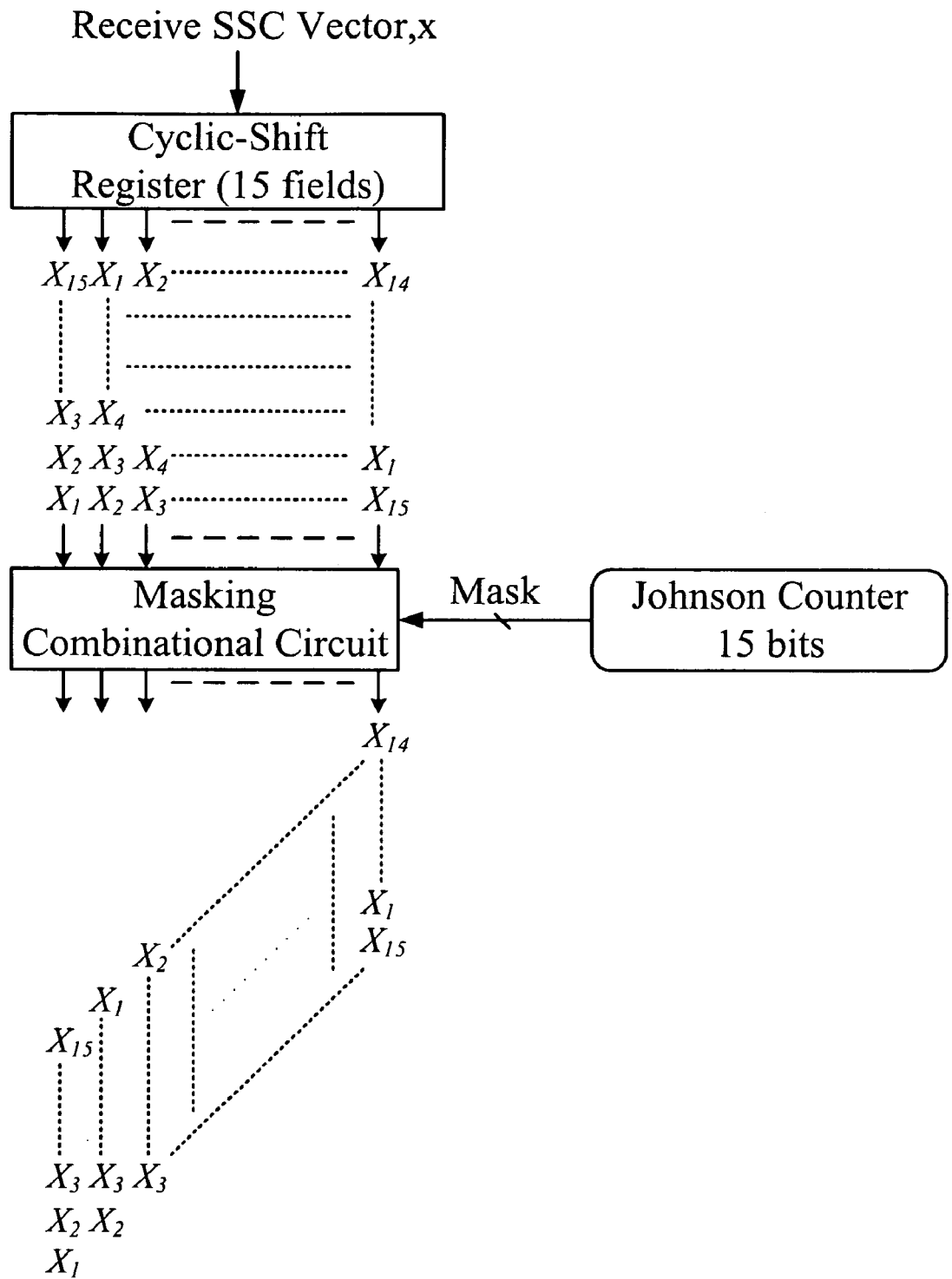
FIG. 2 is a diagram schematically showing an input-signal generator in a conventional technology.
Figure 3:
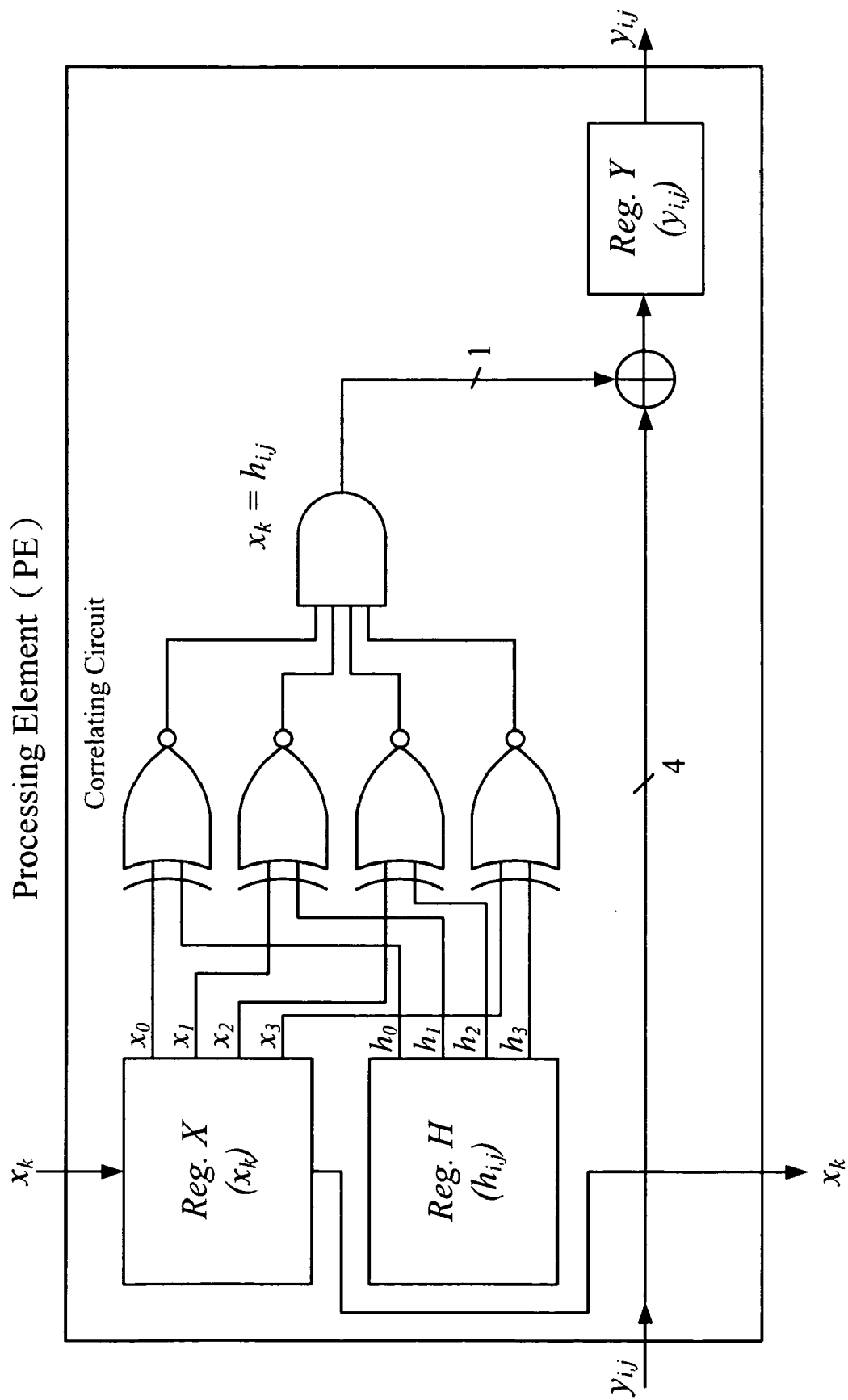
FIG. 3 is a diagram schematically showing a processing element in a conventional technology.
Figure 4:
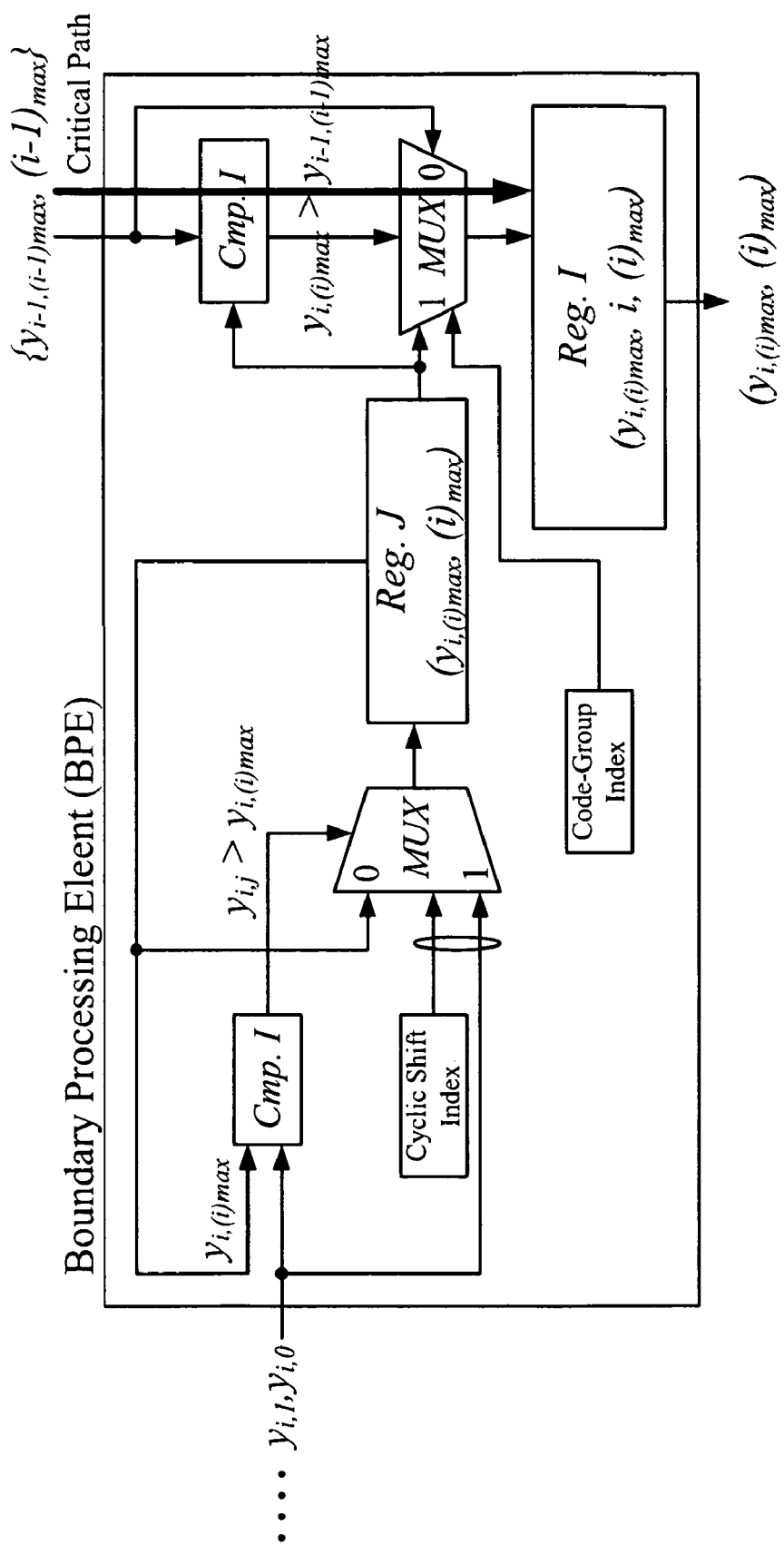
FIG. 4 is a diagram schematically showing a boundary processing element in a conventional technology.
Figure 5:
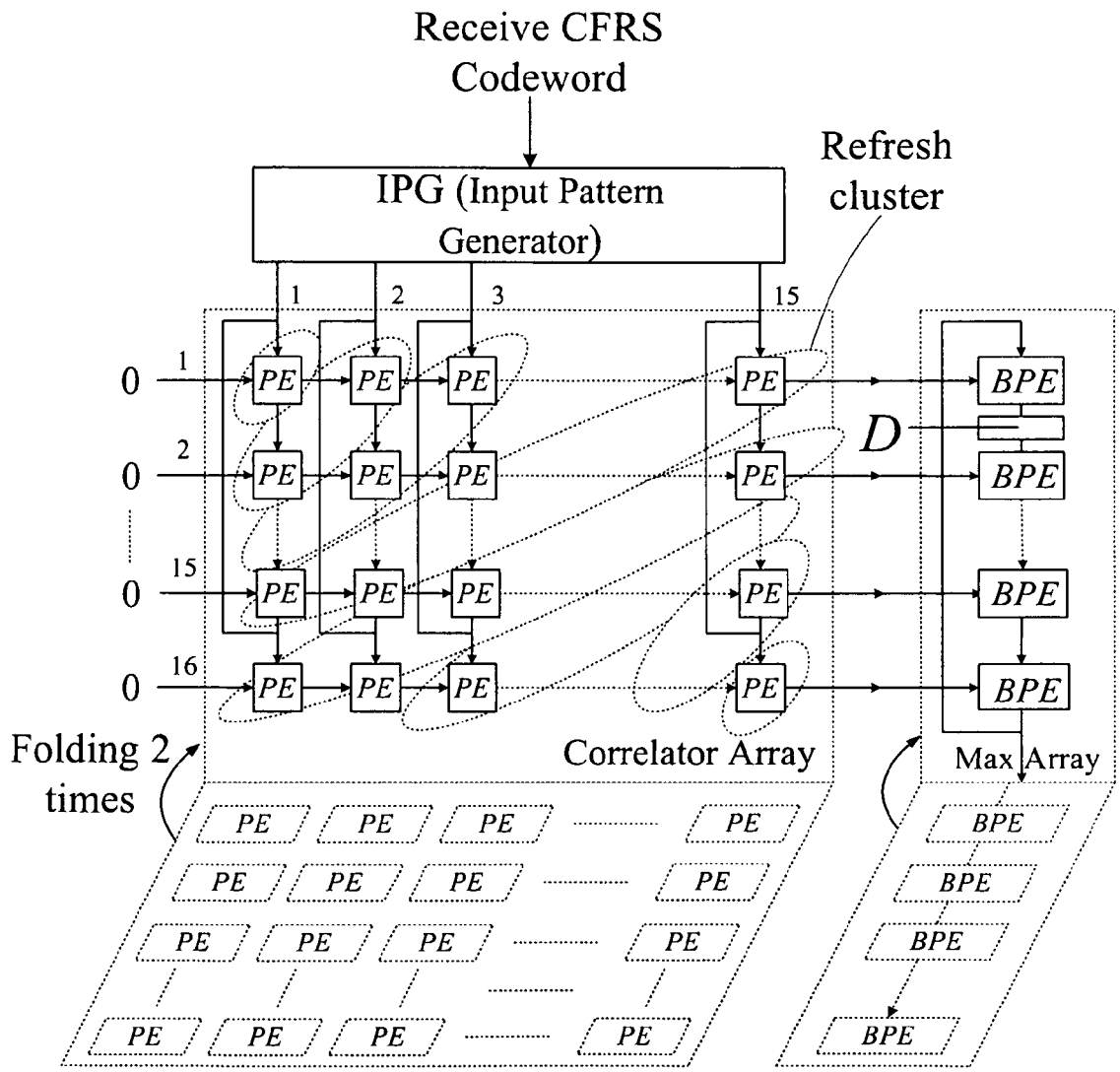
FIG. 5 is a diagram schematically showing a folding technology.
Figure 7:
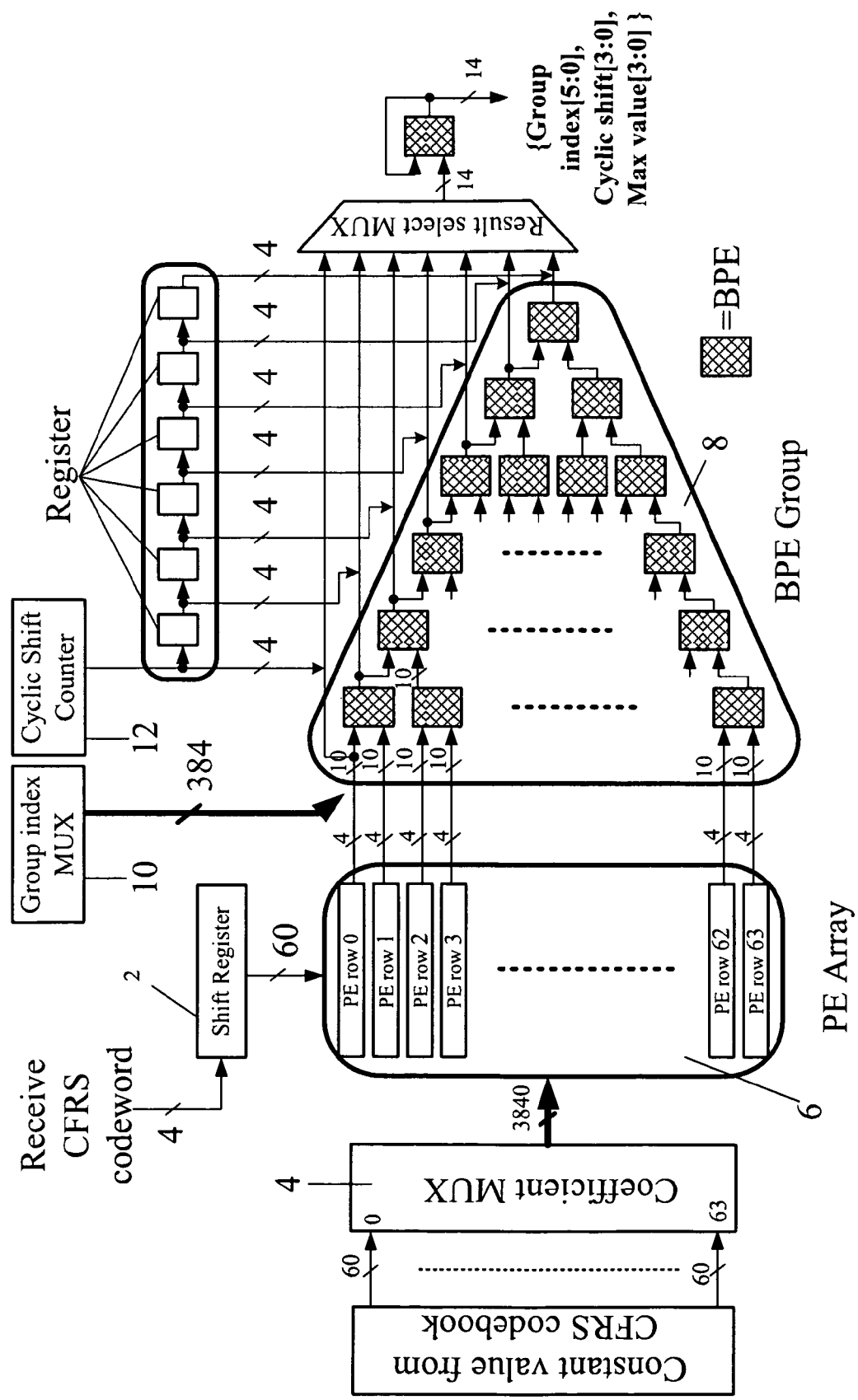
FIG. 7 is a diagram schematically showing the architecture of a configurable hierarchical CFRS decoding circuit according to the present invention.

Refer to FIG. 7 for the architecture of a configurable hierarchical CFRS decoding circuit according to the present invention. The decoding circuit of the present invention comprises a shift register 2, a coefficient multiplexer 4, a processing element (PE) array 6, a boundary processing element (BPE) array 8, a group index multiplexer 10 and a cyclic shift counter 12. The shift register 2 outputs the received CFRS code of an arbitrary cyclic shift to the 64 row PE array 6. The output includes all probable fifteen cyclic shifts, e.g. a feedback shift after fifteen code characters have been received.

Figure 8:
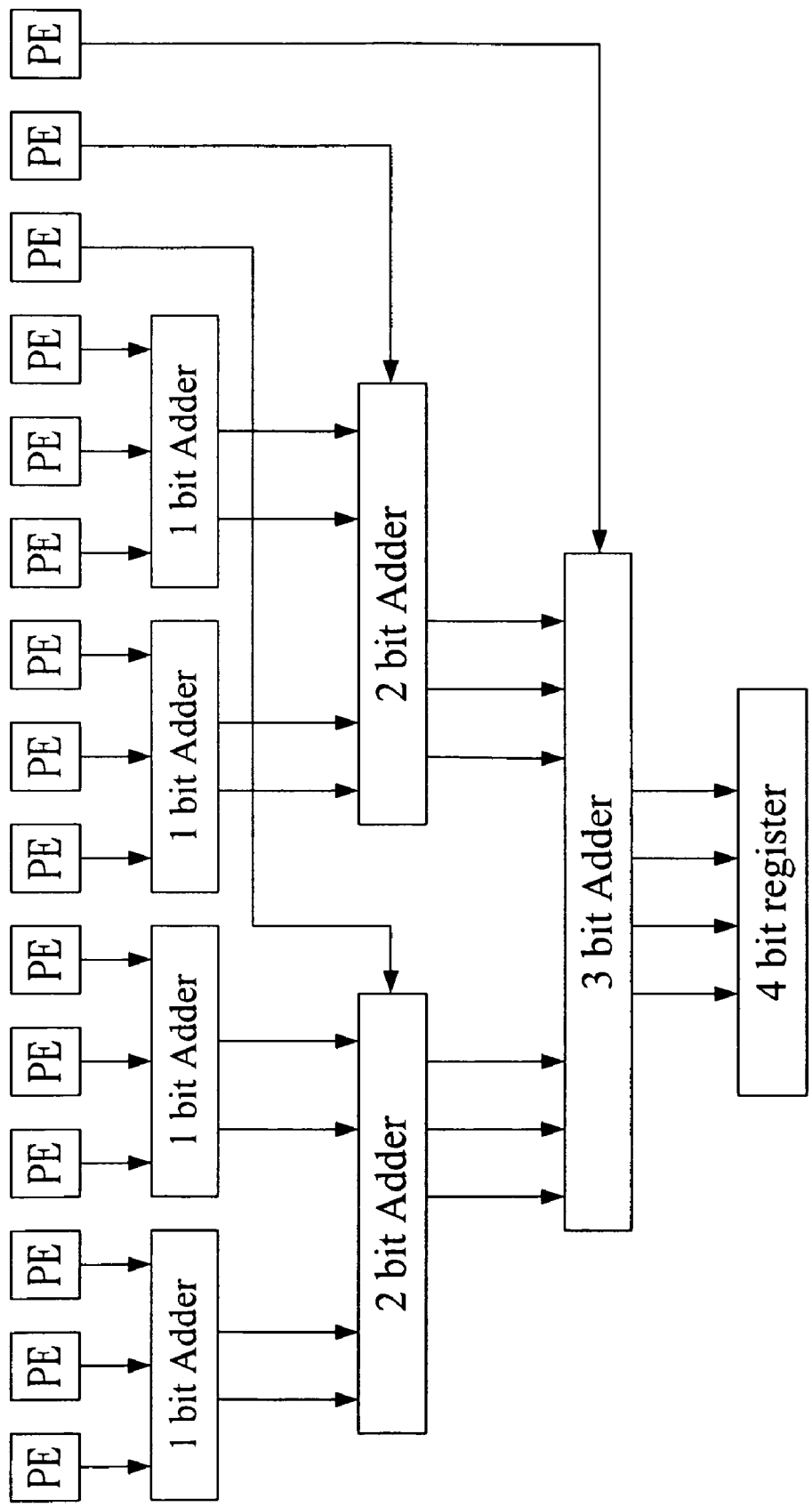
FIG. 8 is a diagram schematically showing the architecture of a processing element row according to the present invention.
Figure 9:
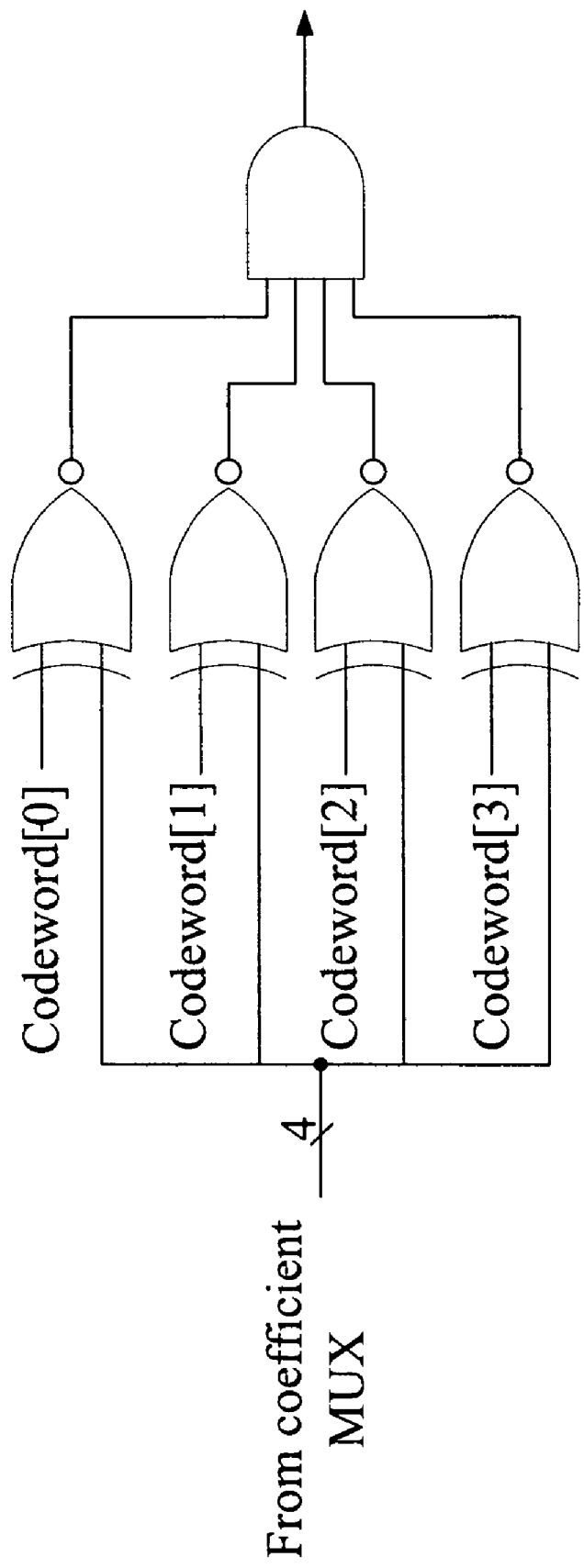
FIG. 9 is a diagram schematically showing a processing element according to the present invention.

The PE array 6 contains 64 rows of identical hierarchical comparison architectures and functions to compare the fifteen sets of probable cyclic shifts generated by the shift register 2 with 64 sets of CFRS codes (denoted by the coefficients). Refer to FIG. 8. A PE row contains fifteen PE's, four 1-bit full adders, two 2-bit full adders, a 3-bit full adder, and a 4-bit register. Refer to FIG. 9. Each PE has four XNOR gates and an AND gate. The PE is a simple circuit used to perform the comparison from 0 to 15. The PE does not output 1 except the received codeword is identical to the coefficient. One PE row receives 60 bits of codewords from the shift register 2 and 60 bits of coefficients from the coefficient multiplexer 4. The hierarchical summation architecture shown in FIG. 8 calculates the summation value of the comparison results of the PE's of the PE row. Then, the succeeding BPE array 8 receives the summation value and compares the summation value with the summation values of the other rows.

Figure 10:
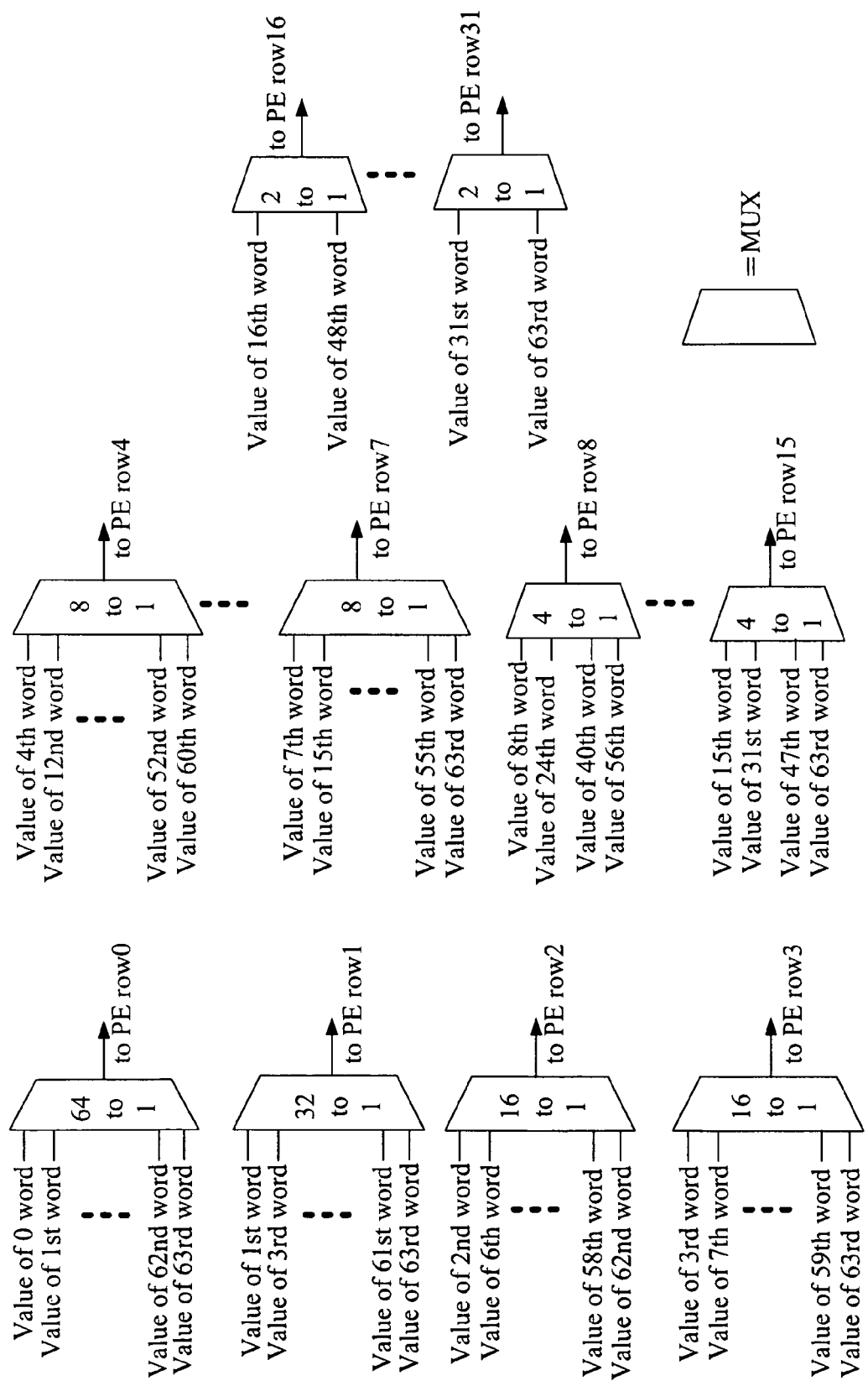
FIG. 10 is a diagram schematically showing the members of a group index multiplexer according to the present invention.

Refer to FIG. 10. The coefficient multiplexer 4 contains thirty-two different-size multiplexers, wherein a 64-to-1 multiplexer is connected to a coefficient input for PE row 0; a 32-to-1 multiplexer is connected to a coefficient input for PE row 1; two 16-to-1 multiplexers are connected to coefficient inputs for PE rows 2 and 3; four 8-to-1 multiplexers are connected to coefficient inputs for PE rows 4-7; eight 4-to-1 multiplexers are connected to coefficient inputs for PE rows 8-15; sixteen 2-to-1 multiplexers are connected to coefficient inputs for PE rows 16-31. In Table.1 are listed the inputs of the thirty-two multiplexers—64 sets of CFRS codes. In the systolic array architecture, the coefficients are stored in a 64×60 ROM. The coefficients for PE rows 32-63 are directly supplied by the lower part of Table.1. In the present invention, the comparison coefficients are not stored in ROM but placed in the input terminals of the multiplexers. Such a design has two advantages: firstly, the multiplexer is simplified to have a very small size in circuit synthesis because the inputs are fixed constants; secondly, the coefficients can be simultaneously supplied to the 64-row PE array 6, which outperforms the conventional technology wherein the ROM can only output one coefficient at a time. In an experimental fabrication, the area of the thirty-two multiplexers is even slightly smaller than the area of a 64×60 ROM (generated by a memory compiler provided by CIC). When different numbers of PE rows are used, an appropriate select-line design can guarantee that correct coefficients are input for matching.

TABLE 1

| CFRS Code Word | Slot number | | | | | | | | | | | | | | |
|---|---|---|---|---|---|---|---|---|---|---|---|---|---|---|---|
| | #0 | #1 | #2 | #3 | #4 | #5 | #6 | #7 | #8 | #9 | #10 | #11 | #12 | #13 | #14 |
| Group 0 | 1 | 1 | 2 | 8 | 9 | 10 | 15 | 8 | 10 | 16 | 2 | 7 | 15 | 7 | 16 |
| Group 1 | 1 | 1 | 5 | 16 | 7 | 3 | 14 | 16 | 3 | 10 | 5 | 12 | 14 | 12 | 10 |
| Group 2 | 1 | 2 | 1 | 15 | 5 | 5 | 12 | 16 | 6 | 11 | 2 | 16 | 11 | 15 | 12 |
| Group 3 | 1 | 2 | 3 | 1 | 8 | 6 | 5 | 2 | 5 | 8 | 4 | 4 | 6 | 3 | 7 |
| Group 4 | 1 | 2 | 16 | 6 | 6 | 11 | 15 | 5 | 12 | 1 | 15 | 12 | 16 | 11 | 2 |
| Group 5 | 1 | 3 | 4 | 7 | 4 | 1 | 5 | 5 | 3 | 6 | 2 | 8 | 7 | 6 | 8 |
| Group 6 | 1 | 4 | 11 | 3 | 4 | 10 | 9 | 2 | 11 | 2 | 10 | 12 | 12 | 9 | 3 |
| Group 7 | 1 | 5 | 6 | 6 | 14 | 9 | 10 | 2 | 13 | 9 | 2 | 5 | 14 | 1 | 13 |
| Group 8 | 1 | 6 | 10 | 10 | 4 | 11 | 7 | 13 | 16 | 11 | 13 | 6 | 4 | 1 | 16 |
| Group 9 | 1 | 6 | 13 | 2 | 14 | 2 | 6 | 5 | 5 | 13 | 10 | 9 | 1 | 14 | 10 |
| Group 10 | 1 | 7 | 8 | 5 | 7 | 2 | 4 | 3 | 8 | 3 | 2 | 6 | 6 | 4 | 5 |
| Group 11 | 1 | 7 | 10 | 9 | 16 | 7 | 9 | 15 | 1 | 8 | 16 | 8 | 15 | 2 | 2 |
| Group 12 | 1 | 8 | 12 | 9 | 9 | 4 | 13 | 16 | 5 | 1 | 13 | 5 | 12 | 4 | 8 |

TABLE 1-continued

| CFRS Code Word | \#0 | \#1 | \#2 | \#3 | \#4 | \#5 | \#6 | \#7 | \#8 | \#9 | \#10 | \#11 | \#12 | \#13 | \#14 |
|---|---|---|---|---|---|---|---|---|---|---|---|---|---|---|---|
| Group 13 | 1 | 8 | 14 | 10 | 14 | 1 | 15 | 15 | 8 | 5 | 11 | 4 | 10 | 5 | 4 |
| Group 14 | 1 | 9 | 2 | 15 | 15 | 16 | 10 | 7 | 8 | 1 | 10 | 8 | 2 | 16 | 9 |
| Group 15 | 1 | 9 | 15 | 6 | 16 | 2 | 13 | 14 | 10 | 11 | 7 | 4 | 5 | 12 | 3 |
| Group 16 | 1 | 10 | 9 | 11 | 15 | 7 | 6 | 4 | 16 | 5 | 2 | 12 | 13 | 3 | 14 |
| Group 17 | 1 | 11 | 14 | 4 | 13 | 2 | 9 | 10 | 14 | 16 | 8 | 5 | 3 | 15 | 6 |
| Group 18 | 1 | 12 | 12 | 13 | 14 | 7 | 2 | 8 | 12 | 2 | 1 | 13 | 11 | 8 | 11 |
| Group 19 | 1 | 12 | 15 | 5 | 4 | 14 | 3 | 16 | 7 | 8 | 6 | 2 | 10 | 11 | 13 |
| Group 20 | 1 | 15 | 4 | 3 | 7 | 6 | 10 | 13 | 12 | 5 | 14 | 16 | 8 | 2 | 11 |
| Group 21 | 1 | 16 | 3 | 12 | 11 | 9 | 13 | 5 | 8 | 2 | 14 | 7 | 4 | 10 | 5 |
| Group 22 | 2 | 2 | 5 | 10 | 16 | 11 | 3 | 10 | 11 | 8 | 5 | 13 | 3 | 13 | 8 |
| Group 23 | 2 | 2 | 12 | 3 | 15 | 5 | 8 | 3 | 5 | 14 | 12 | 9 | 8 | 9 | 14 |
| Group 24 | 2 | 3 | 6 | 16 | 12 | 16 | 3 | 13 | 13 | 6 | 7 | 9 | 2 | 12 | 7 |
| Group 25 | 2 | 3 | 8 | 2 | 9 | 15 | 14 | 3 | 14 | 9 | 5 | 5 | 15 | 8 | 12 |
| Group 26 | 2 | 4 | 7 | 9 | 5 | 4 | 9 | 11 | 2 | 14 | 5 | 14 | 11 | 16 | 16 |
| Group 27 | 2 | 4 | 13 | 12 | 12 | 7 | 15 | 10 | 5 | 2 | 15 | 5 | 13 | 7 | 4 |
| Group 28 | 2 | 5 | 9 | 9 | 3 | 12 | 8 | 14 | 15 | 12 | 14 | 5 | 3 | 2 | 15 |
| Group 29 | 2 | 5 | 11 | 7 | 2 | 11 | 9 | 4 | 16 | 7 | 16 | 9 | 14 | 14 | 4 |
| Group 30 | 2 | 6 | 2 | 13 | 3 | 3 | 12 | 9 | 7 | 16 | 6 | 9 | 16 | 13 | 12 |
| Group 31 | 2 | 6 | 9 | 7 | 7 | 16 | 13 | 3 | 12 | 2 | 13 | 12 | 9 | 16 | 6 |
| Group 32 | 2 | 7 | 12 | 15 | 2 | 12 | 4 | 10 | 13 | 15 | 13 | 4 | 5 | 5 | 10 |
| Group 33 | 2 | 7 | 14 | 16 | 5 | 9 | 2 | 9 | 16 | 11 | 11 | 5 | 7 | 4 | 14 |
| Group 34 | 2 | 8 | 5 | 12 | 5 | 2 | 14 | 14 | 8 | 15 | 3 | 9 | 12 | 15 | 9 |
| Group 35 | 2 | 9 | 13 | 4 | 2 | 13 | 8 | 11 | 6 | 4 | 6 | 8 | 15 | 15 | 11 |
| Group 36 | 2 | 10 | 3 | 2 | 13 | 16 | 8 | 10 | 8 | 13 | 11 | 11 | 16 | 3 | 5 |
| Group 37 | 2 | 11 | 15 | 3 | 11 | 6 | 14 | 10 | 15 | 10 | 6 | 7 | 7 | 14 | 3 |
| Group 38 | 2 | 16 | 4 | 5 | 16 | 14 | 7 | 11 | 4 | 11 | 14 | 9 | 9 | 7 | 5 |
| Group 39 | 3 | 3 | 4 | 6 | 11 | 12 | 13 | 6 | 12 | 14 | 4 | 5 | 13 | 5 | 14 |
| Group 40 | 3 | 3 | 6 | 5 | 16 | 9 | 15 | 5 | 9 | 10 | 6 | 4 | 15 | 4 | 10 |
| Group 41 | 3 | 4 | 5 | 14 | 4 | 6 | 12 | 13 | 5 | 13 | 6 | 11 | 11 | 12 | 14 |
| Group 42 | 3 | 4 | 9 | 16 | 10 | 4 | 16 | 15 | 3 | 5 | 10 | 5 | 15 | 6 | 6 |
| Group 43 | 3 | 4 | 16 | 10 | 5 | 10 | 4 | 9 | 9 | 16 | 15 | 6 | 3 | 5 | 15 |
| Group 44 | 3 | 5 | 12 | 11 | 14 | 5 | 11 | 13 | 3 | 6 | 14 | 6 | 13 | 4 | 4 |
| Group 45 | 3 | 6 | 4 | 10 | 6 | 5 | 9 | 15 | 4 | 15 | 5 | 16 | 16 | 9 | 10 |
| Group 46 | 3 | 7 | 8 | 8 | 16 | 11 | 12 | 4 | 15 | 11 | 4 | 7 | 16 | 3 | 15 |
| Group 47 | 3 | 7 | 16 | 11 | 4 | 15 | 3 | 15 | 11 | 12 | 12 | 4 | 7 | 7 | 16 |
| Group 48 | 3 | 8 | 7 | 15 | 4 | 8 | 15 | 12 | 3 | 16 | 4 | 16 | 12 | 11 | 11 |
| Group 49 | 3 | 8 | 15 | 4 | 16 | 4 | 8 | 7 | 7 | 15 | 12 | 11 | 3 | 16 | 12 |
| Group 50 | 3 | 10 | 10 | 15 | 16 | 5 | 4 | 6 | 16 | 4 | 3 | 15 | 9 | 6 | 9 |
| Group 51 | 3 | 13 | 11 | 5 | 4 | 12 | 4 | 11 | 6 | 6 | 5 | 3 | 14 | 13 | 12 |
| Group 52 | 3 | 14 | 7 | 9 | 14 | 10 | 13 | 8 | 7 | 8 | 10 | 4 | 4 | 13 | 9 |
| Group 53 | 5 | 5 | 8 | 14 | 16 | 13 | 6 | 14 | 13 | 7 | 8 | 15 | 6 | 15 | 7 |
| Group 54 | 5 | 6 | 11 | 7 | 10 | 8 | 5 | 8 | 7 | 12 | 12 | 10 | 6 | 9 | 11 |
| Group 55 | 5 | 6 | 13 | 8 | 13 | 5 | 7 | 7 | 6 | 16 | 14 | 15 | 8 | 16 | 15 |
| Group 56 | 5 | 7 | 9 | 10 | 7 | 11 | 6 | 12 | 9 | 12 | 11 | 8 | 8 | 6 | 10 |
| Group 57 | 5 | 9 | 6 | 8 | 10 | 9 | 8 | 12 | 5 | 11 | 10 | 11 | 12 | 7 | 7 |
| Group 58 | 5 | 10 | 10 | 12 | 8 | 11 | 9 | 7 | 8 | 9 | 5 | 12 | 6 | 7 | 6 |
| Group 59 | 5 | 10 | 12 | 6 | 5 | 12 | 8 | 9 | 7 | 6 | 7 | 8 | 11 | 11 | 9 |
| Group 60 | 5 | 13 | 15 | 15 | 14 | 8 | 6 | 7 | 16 | 8 | 7 | 13 | 14 | 5 | 16 |
| Group 61 | 9 | 10 | 13 | 10 | 11 | 15 | 15 | 9 | 16 | 12 | 14 | 13 | 16 | 14 | 11 |
| Group 62 | 9 | 11 | 12 | 15 | 12 | 9 | 13 | 13 | 11 | 14 | 10 | 16 | 15 | 14 | 16 |
| Group 63 | 9 | 12 | 10 | 15 | 13 | 14 | 9 | 14 | 15 | 11 | 11 | 13 | 12 | 16 | 10 |

Figure 11:
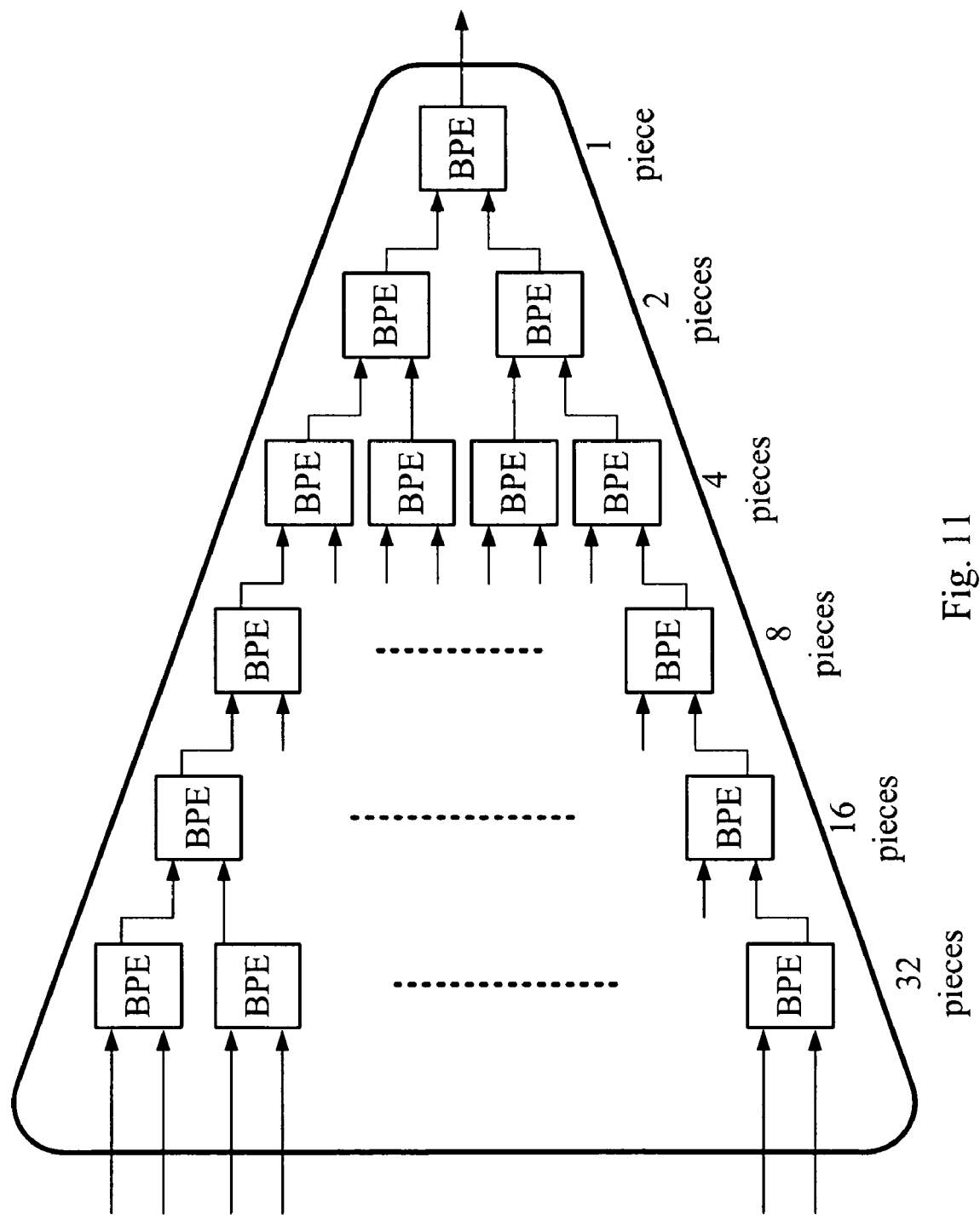
FIG. 11 is a diagram schematically showing the members of a boundary processing element array according to the present invention.
Figure 12:
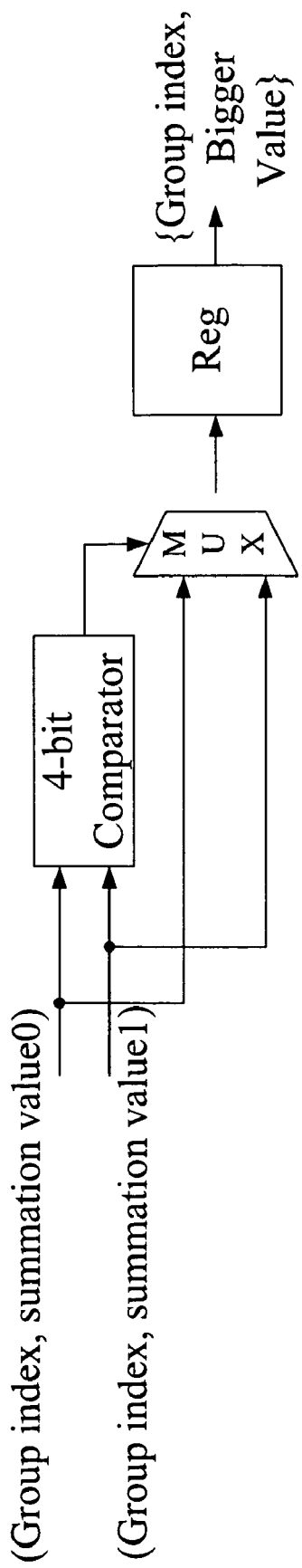
FIG. 12 is a diagram schematically showing a boundary processing element according to the present invention.

The left side of the PE array 6 is connected to the parallel-comparison BPE array 8. Refer to FIG. 11. The outputs of each two adjacent BPEs are compared in a forward BPE. Refer to FIG. 12. Each BPE contains a simple comparator circuit, which compares two input values and then stores the greater value in a register. Such a circuit spends only the time of 6 cycles on obtaining the maximum value from the 64 pieces of data.

When the PE array 6 outputs the related values, the group index multiplexer 10 attaches the group indexes to the related values and then transmits the indexed related values to the BPE array 8, whereby the system can learn which group of coefficient the maximum value output by the BPE array 8 belongs to. Then, the 8 sets of scrambling codes are compared according to the group indexes during the scrambling code synchronization in the third stage of the WCDMA system. Similar to the coefficient multiplexer 4, the group index multiplexer 10 also contains thirty-two different-size multiplexers. However, the group index multiplexer 10 is different from the coefficient multiplexer 4 in the inputs. The inputs of the coefficient multiplexer 4 are the coefficients of from Group 0 to Group 63, but the inputs of the group index multiplexer 10 are the constants of from 0 to 63.

The cyclic shift counter 12 outputs the values of the cyclic shifts. After receiving the abovementioned CFRS code sets, the shift register 2 performs fifteen types of cyclic shifts on the CFRS codes and outputs the results to the PE array 6 for the related calculations. As shown in FIG. 7, the shift register 2 uses the outputs of the cyclic shift counter 12 to generate seven outputs adhering to seven outputs of the BPE array 8. Such an operation is to record which cyclic shift generates the current related value output by the PE array 6. Thus, the BPE comparisons will not cause the loss of the cyclic shift of the maximum value. The output cyclic shift value then completes the frame boundary of the second stage of the WCDMA system.

Figure 13:
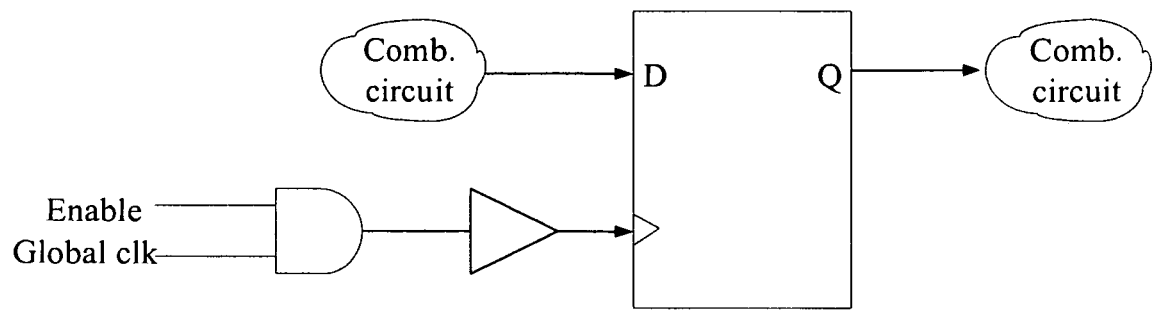
FIG. 13 is a diagram schematically showing a clock gating according to the present invention.
Figure 14:
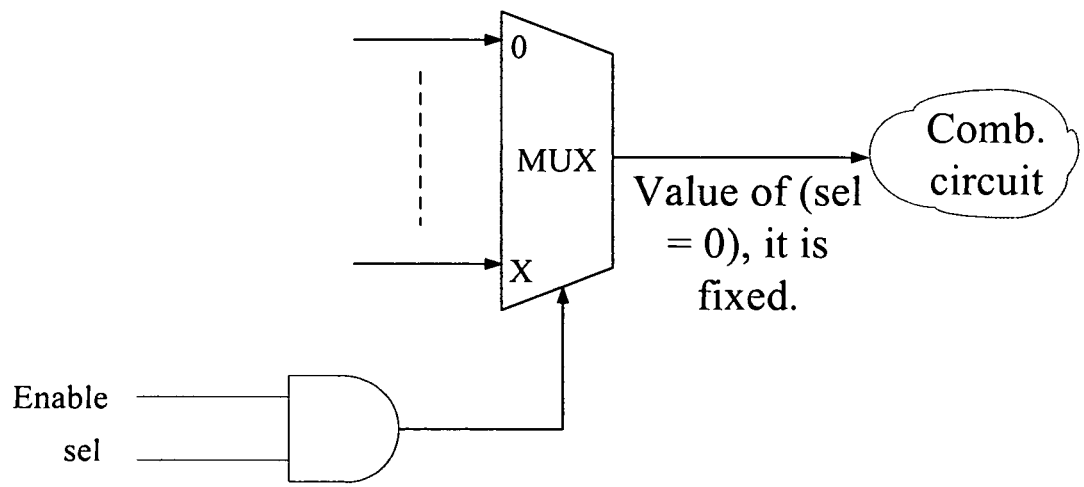
FIG. 14 is a diagram schematically showing a MUX select gating according to the present invention.

In the present invention, the user can select one operation mode from the 64-row, 32-row, 16-row, 8-row, 4-row, 2-row, and 1-row modes to meet the requirement in speed or power consumption. When the system does not operate in the 64-row mode, the inactive circuits should be turned off. Refer to FIG. 13. The present invention adopts a clock gating technology to replace the D-type flip-flop and save the power dynamically consumed in the D-type flip-flop and the clock buffer tree thereof. Refer to FIG. 14. An AND gate is added to the select line between the coefficient multiplexer 4 and the group index multiplexer 10 to control the data signal. Adding AND gate to the output of the multiplexer will increase more circuit area because the output of one multiplexer has sixty bits of data, and the succeeding circuit will not have any state transition because the output coefficients are fixed, and dynamic power consumption is thus required.

In a higher-row operation mode, the decoding rate of the parallel processing architecture of the present invention is much faster than that of the conventional systolic architecture. Table.2 shows the comparison of the decoding rates of the present invention and the systolic architecture.

TABLE 2

| | Hierarchical Architecture Decoding Latency (Cycle Number) | Systolic Architecture Decoding Latency (Cycle Number) |
| --- | --- | --- |
| 64 row | 15 + 6 + 1 = 22 | 94 |
| 32 row | 15 * 2 + 5 + 1 = 36 | 94 |
| 16 row | 15 * 4 + 4 + 1 = 65 | 94 |
| 8 row | 15 * 8 + 3 + 1 = 124 | 135 |
| 4 row | 15 * 16 + 2 + 1 = 243 | 255 |
| 2 row | 15 * 32 + 1 + 1 = 482 | 495 |
| 1 row | 15 * 64 + 1 = 961 | 975 |

The present invention applies to the fast decoding circuit and method for the CFRS code of the 3GPP WCDMA system and can simultaneously meets the requirements of three most common communication systems: WCDMA, CDMA2000 and 802.11. There are various reasons to integrate the three communication systems. Firstly, they all belong to the CDMA (Direct Sequent Spread Spectrum) system and thus have similar synchronization ways. Secondly, they all belong to the 3G mobile phone system, and some mobile phones can work in two of the three systems. Thirdly, as the integration of the synchronization functions of the 3G mobile communication systems does not consume too much hardware, the baseband chip manufacturers may directly adopt the present invention in their products and needn't respectively fabricate different chips for different systems; thus the manufacturers can advance the timing that the baseband chips enter the market. Lastly, the mobile phone is hard to parallel the wireless network in data transmission rate, even the 3G mobile phone; therefore, integrating the wireless synchronization can provide a greater bandwidth for users. By the way, the three communication systems respectively adopt different synchronization codes and different synchronization algorithms in their synchronization mechanisms.

The embodiments described above are only to exemplify the present invention but not to limit the scope of the present invention. Therefore, any equivalent modification or variation according to the shapes, structures, characteristics, and spirit of the present invention is to be also included within the scope of the present invention.

What is claimed is:

1. A configurable hierarchical comma-free Reed-Solomon decoding circuit comprising:
    an input-pattern generator generating a combination of at least one cyclic shift for a received comma-free Reed-Solomon (CFRS) code with an arbitrary cyclic shift, outputting said combination by a hierarchical parallel way, and further comprising
    a shift register receiving codewords of said CFRS code, performing cyclic shifts on said codewords of said CFRS code, and outputting said CFRS code with a plurality of sets of cyclic shifts;
    a coefficient multiplexer including a plurality of multiplexers with different sizes, receiving said codewords, performing comparisons on said codewords, and outputting comparison results; and
    a processing element (PE) array including a plurality of processing elements, performing related comparisons on all probable cyclic shifts generated by said shift register and all CFRS codes, and outputting comparison results;
    a boundary processing element (BPE) array including a plurality of boundary processing elements, receiving and performing comparisons on values output by said input-pattern generator, and storing larger values in a register;
    a group index multiplexer attaching group indexes to related values output by said processing element array and transmitting indexed said related values to said boundary processing element array, wherein said boundary processing element array performs comparisons to obtain a coefficient required by CFRS decoding; and
    a cyclic shift counter outputting said cyclic shifts.

2. The configurable hierarchical comma-free Reed-Solomon decoding circuit according to claim 1, wherein said shift register receives fifteen codewords of said CFRS codes, performs cyclic shifts on said fifteen codewords, and outputs said CFRS codes with fifteen sets of cyclic shifts.

3. The configurable hierarchical comma-free Reed-Solomon decoding circuit according to claim 1, wherein said coefficient multiplexer includes one 64-to-1 multiplexer connected to a coefficient input for PE row 0; one 32-to-1 multiplexer connected to a coefficient input for PE row 1; two 16-to-1 multiplexers connected to coefficient inputs for PE rows 2 and 3; four 8-to-1 multiplexers connected to coefficient inputs for PE rows 4-7; eight 4-to-1 multiplexers connected to coefficient inputs for PE rows 8-15; sixteen 2-to-1 multiplexers connected to coefficient inputs for PE rows 16-31.

4. The configurable hierarchical comma-free Reed-Solomon decoding circuit according to claim 1, wherein said processing element array includes 64×15 pieces of processing elements.

5. The configurable hierarchical comma-free Reed-Solomon decoding circuit according to claim 1, wherein said boundary processing element includes a 4-bit comparator, a multiplexer and a 4-bit register; said 4-bit comparator compares two pieces of input data and sends a comparison result to said multiplexer; said multiplexer stores one piece of said input data having a greater size in said 4-bit register.

6. The configurable hierarchical comma-free Reed-Solomon decoding circuit according to claim 1, wherein one of said group indexes is selected to remain unknown until said boundary processing element array has obtained a final maximum value.

7. The configurable hierarchical comma-free Reed-Solomon decoding circuit according to claim 1, wherein system synchronization of a WCDMA (Wideband Code Division Multiple Access) communication system is completed after said coefficient required by CFRS decoding is compared with eight sets of probable scrambling codes of third stage of said WCDMA system.

8. The configurable hierarchical comma-free Reed-Solomon decoding circuit according to claim 1, wherein said boundary processing element array includes 64×1 pieces of boundary processing elements.

9. The configurable hierarchical comma-free Reed-Solomon decoding circuit according to claim 1, wherein said cyclic shifts have fifteen types of combinations.

10. The configurable hierarchical comma-free Reed-Solomon decoding circuit according to claim 1, wherein said boundary processing element array includes comparator circuits.

11. The configurable hierarchical comma-free Reed-Solomon decoding circuit according to claim 1, wherein values of said cyclic shifts provide frame boundaries of second stage of a WCDMA (Wideband Code Division Multiple Access) communication system.

12. The configurable hierarchical comma-free Reed-Solomon decoding circuit according to claim 1, wherein said processing element array includes 1-15 pieces of processing elements.

13. The configurable hierarchical comma-free Reed-Solomon decoding circuit according to claim 12, wherein said processing element includes a first 1-bit full adder, a second 1-bit full adder, a third 1-bit full adder, a fourth 1-bit full adder, a first 2-bit full adder, a second 2-bit full adder, a 3-bit full adder, and a 4-bit register.

14. The configurable hierarchical comma-free Reed-Solomon decoding circuit according to claim 13, wherein said first 1-bit full adder calculates signals sent by the first said processing element to the third said processing element.

15. The configurable hierarchical comma-free Reed-Solomon decoding circuit according to claim 13, wherein said second 1-bit full adder calculates signals sent by fourth said processing element to the sixth said processing element.

16. The configurable hierarchical comma-free Reed-Solomon decoding circuit according to claim 13, wherein said third 1-bit full adder calculates signals sent by from the seventh said processing element to the ninth said processing element.

17. The configurable hierarchical comma-free Reed-Solomon decoding circuit according to claim 13, wherein said fourth 1-bit full adder calculates signals sent by from the tenth said processing element to the twelfth said processing element.

18. The configurable hierarchical comma-free Reed-Solomon decoding circuit according to claim 13, wherein said first 2-bit full adder calculates an output of the thirteenth processing element and calculation results of said first 1-bit full adder and said second 1-bit full adder; said second 2-bit full adder calculates an output of the fourteenth processing element and calculation results of said third 1-bit full adder and said fourth 1-bit full adder; said 3-bit full adder calculates an output of the fifteenth processing element and calculation results of said first 2-bit full adder and said second 2-bit full adder and outputs calculation results to said 4-bit register.

19. The configurable hierarchical comma-free Reed-Solomon decoding circuit according to claim 1, wherein said processing element includes a first XNOR gate, a second XNOR gate, a third XNOR gate, a fourth XNOR gate, and an AND gate; XNOR operations are performed on a code received by said processing element and said coefficient; if said code and said coefficient are identical, said XNOR gate outputs 1; said AND gate performs a calculation on outputs of said first XNOR gate, said second XNOR gate, said third XNOR gate, said fourth XNOR gate; when outputs of said first XNOR gate, said second XNOR gate, said third XNOR gate, said fourth XNOR gate are all 1's, said AND gate outputs 1, which means that said code and said coefficient are completely identical.

20. The configurable hierarchical comma-free Reed-Solomon decoding circuit according to claim 1, wherein AND gates are added to select lines of said coefficient multiplexer and said group index multiplexer to perform control functions.

21. The configurable hierarchical comma-free Reed-Solomon decoding circuit according to claim 1, wherein said coefficient multiplexer and said group index multiplexer use a clock gating technology to replace a D-type flip-flop and save power dynamically consumed in said D-type flip-flop and a clock buffer tree thereof.

22. A method for configurablizing a hierarchical comma-free Reed-Solomon decoding circuit comprises steps:
generating a combination of at least one cyclic shift for a received comma-free Reed-Solomon (CFRS) code with an arbitrary cyclic shift and outputting said combination by a hierarchical parallel way;
performing comparisons on all output values and storing greater said output values in a register; and
comparing said values stored in said register with related values of a system to obtain coefficients required by CFRS decoding.

23. The method for configurablizing a hierarchical comma-free Reed-Solomon decoding circuit according to claim 22, wherein said related values of said system are output by a processing element array containing a plurality of processing elements.

* * * * *